(12) United States Patent
Takamura et al.

(10) Patent No.: US 7,560,775 B2
(45) Date of Patent: Jul. 14, 2009

(54) TRANSISTOR AND TRANSISTOR MANUFACTURING METHOD

(75) Inventors: Yoshiji Takamura, Fukuyama (JP);
Noboru Takeuchi, Fukuyama (JP);
Satoru Yamagata, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 44 days.

(21) Appl. No.: 11/478,854

(22) Filed: Jul. 3, 2006

(65) Prior Publication Data
US 2007/0023792 A1 Feb. 1, 2007

(30) Foreign Application Priority Data
Jul. 1, 2005 (JP) .............................. 2005-193782

(51) Int. Cl.
*H01L 27/088* (2006.01)
(52) U.S. Cl. ............... 257/345; 257/401; 257/E29.255; 438/294
(58) Field of Classification Search ................. 257/368, 257/374, 395, 396, 506, 345, 401
See application file for complete search history.

(56) References Cited

U.S. PATENT DOCUMENTS

| 5,831,323 | A | 11/1998 | Motonami et al. | |
|---|---|---|---|---|
| 6,277,697 | B1 * | 8/2001 | Lee | 438/296 |
| 6,500,726 | B2 * | 12/2002 | Lee et al. | 438/424 |
| 6,642,589 | B2 * | 11/2003 | Wada et al. | 257/397 |
| 7,071,515 | B2 * | 7/2006 | Sheu et al. | 257/374 |
| 2004/0016956 | A1 * | 1/2004 | Choi et al. | 257/315 |

FOREIGN PATENT DOCUMENTS

| JP | 8-316223 A | 11/1996 |
|---|---|---|
| JP | 2000-022153 | 1/2000 |

OTHER PUBLICATIONS

M. Nandakumar, et al., Shallow Trench Isolation for Advanced ULSI CMOS Technologies, International Electron Device Meeting, (1998), pp. 133-136.

* cited by examiner

*Primary Examiner*—Minh-Loan T Tran
*Assistant Examiner*—W. Wendy Kuo
(74) *Attorney, Agent, or Firm*—Nixon & Vanderhye P.C.

(57) ABSTRACT

In a transistor of the invention, at a boundary between gate oxide 112 formed on a silicon substrate 101 of a device formation region 10 and a device isolation film 110 adjoining the gate oxide 112, a thickness D' of the gate electrode 114 is set larger than a uniform thickness D of the gate electrode 114 on the gate oxide 112. A height difference A between a surface of the gate oxide 112 and a surface of the device isolation film 110, a width B of a step portion 110b of the device isolation film, and the thickness D of the gate electrode 114 in its uniform-thickness portion satisfy relationships that D>B and $A/D+(1-(B/D)^2)^{0.5}>1$. By ion implantation via the gate electrode 114 and the gate oxide 112, an impurity is added into a surface portion of the silicon substrate 101 at an end portion 11 of the device formation region, the impurity having concentrations higher than in the surface portion of the silicon substrate 101 in the electrode uniform portion 12 of the device formation region. The transistor can be prevented from occurrence of the inverse narrow channel effect and kink characteristics, thus being suitable for scale-down of LSIs, and yet can be manufactured with less steps.

7 Claims, 12 Drawing Sheets

TRANSISTOR AND TRANSISTOR MANUFACTURING METHOD

CROSS-REFERENCE TO RELATED APPLICATIONS

This nonprovisional application claims priority under 35 U.S.C. §119(a) on Patent Application No(s). 2005-193782 filed in Japan on Jul. 1, 2005, the entire contents of which are hereby incorporated by reference.

BACKGROUND

The present technology relates to a transistor and transistor manufacturing method. In particular, the technology relates to a transistor and transistor manufacturing method capable of reducing occurrence of the inverse narrow channel effect and kink characteristics due to scale-down.

Conventionally, with the progress of scale-down of LSIs (Large-Scale Integrated circuits), there have been demands also for scale-down of the device formation region, which is a region where MOS (Metal Oxide Semiconductor) transistors and the like are fabricated, as well as scale-down of the device isolation films which define the device formation region, on a semiconductor substrate. As a technique for implementing such scale-down of device formation regions and device isolation films, STI (Shallow Trench Isolation) process wherein a trench is formed on the semiconductor substrate and thereafter a dielectric film is buried in this trench to form the device isolation film is often used.

However, the device formation region defined by the device isolation films formed by the STI process has problems of parasitic transistors or the like. More specifically, when a device isolation film 406 is formed on a silicon substrate 401 by STI process as shown in a sectional view of FIG. 4, a side face of the silicon substrate 401 adjoins a gate electrode 408 via a gate insulator 407 at an end portion (a portion surrounded by a broken-line circle) of the device formation region adjacent to the device isolation film 406. As a result of this, an electric field derived from the gate electrode 408 is applied to the end portion of the device formation region not only from the surface but also the side face as indicated by arrow F, resulting in a concentration of the electric field. Accordingly, a so-called parasitic transistor that causes the threshold voltage to locally lower is formed at the end portion of the device formation region. As a consequence, the transistor formed in the device formation region is subject to occurrence of the inverse narrow channel effect that the threshold voltage of the transistor increasingly lowers with narrowing gate width of the transistor, or the kink characteristics that the drain current increases discontinuously in the subthreshold region of gate voltage—drain current characteristics of the transistor. This gives rise to a problem that the OFF-state current of the transistor increases, leading to an increase in LSI power consumption.

In order to solve these problems, conventionally, there has been proposed a technique for relaxing the concentration of an electric field in the end portion of the device formation region by forming the cross-sectional configuration of the end portion of the device formation region to a rounded configuration (see International Electron Device Meeting, IEDM 98, pp. 133-136).

One example of such a transistor manufacturing method for forming the cross-sectional configuration of an end portion of the device formation region into a rounded one as described above (hereinafter, referred to as first prior art) is shown in process diagrams of FIGS. 5A to 5F.

First, pad oxide 502 is formed on a silicon substrate 501 by thermal oxidation, and silicon nitride 503 is deposited thereon. After that, as shown in FIG. 5A, portions of the silicon nitride 503, the pad oxide 502 and the silicon substrate 501 positioned where a device isolation film is to be formed are etched by RIE (Reactive Ion Etching) process to form a trench 504. Subsequently, as shown in FIG. 5B, the pad oxide 502 exposed to the inner side face of the trench 504 is etched by wet etching so that the surface of the pad oxide 502 exposed to the trench 504 is moved back along the planar direction of the substrate. Then, as shown in FIG. 5C, the surface of the silicon substrate 501 exposed to the trench 504 is oxidized at temperatures of 1000 to 1100° C. in, for example, a hydrochloric-acid or other halogen-based gas atmosphere, by which thermal oxide 505 is formed. By this oxidation process, damage of the exposed surface of the silicon substrate 501 that has occurred in the etching by the RIE process can be removed and moreover corner portions of the silicon substrate 501 in end portions of the device formation region can be rounded. Subsequently, as shown in FIG. 5D, silicon oxide 506 is deposited by CVD (Chemical Vapor Deposition) process so that the trench 504 is buried. After that, the surface of the silicon oxide 506 is polished by CMP (Chemical Mechanical Polish) process, thereby making the surface of the silicon oxide 506 and the surface of the silicon nitride 503 flush with each other as shown in FIG. 5E. Then, the silicon nitride 503 is removed as shown in FIG. 5F, by which a device formation region, which is a portion where the pad oxide 502 on the silicon substrate 501 is provided, and a device isolation film formed of the silicon oxide 506, which defines the device formation region, can be obtained. By forming a source and a drain in the device formation region, a MOS transistor can be obtained.

Also, for the prevention of occurrence of the inverse narrow channel effect or kink characteristics of the transistor formed in the device formation region, there has conventionally been proposed a technique for burying portions between the side face at end portions of the device formation region and the device isolation film with oxide (see JP 2000-22153 A).

One example of such a transistor manufacturing method including the step of burying portions between the side face at end portions of the device formation region and the device isolation film with oxide is shown in FIGS. 6A to 6I (hereinafter, referred to as second prior art).

First, as shown in FIG. 6A, pad oxide 602 is formed on a silicon substrate 601 by thermal oxidation, and silicon nitride 603 is deposited on the pad oxide 602. After that, portions of the pad oxide 602, the silicon nitride 603 and the silicon substrate 601 positioned where a device isolation film is to be formed are etched by RIE process to form a trench 604. This trench 604 is formed shallow, and the portion of the silicon substrate 601 corresponding to the trench 604 is formed into such a tapered shape as to be narrowed in width increasingly toward the bottom face. Subsequently, the exposed surface of the silicon substrate 601 in the trench 604 is oxidized to form oxide 612, and thereafter, as shown in FIG. 6B, polysilicon 613 is deposited on the surface of the silicon nitride 603 and the surface of the trench 604. Then, all of the polysilicon 613 is oxidized, by which such thermal oxide 614 as shown in FIG. 6C is formed. Subsequently, the thermal oxide 614 and the oxide 612 are subjected to anisotropic etching. As a result of this, as shown in FIG. 6D, a side wall 615 made of part of the thermal oxide 614 is formed between a face of the silicon nitride 603 directed toward inside of the trench 604 and the tapered portion of the oxide 602. Then, as shown in FIG. 6E, the silicon substrate 601 exposed to the bottom of the trench 604 is further etched by RIE process so that the depth of the trench 604 is increased. The exposed surface of the silicon substrate 601 within the trench 604 of the increased depth is thermally oxidized, by which thermal oxide 605 is formed. Subsequently, as shown in FIG. 6F, silicon oxide 606 is deposited by CVD process so as to bury the trench 604 and moreover cover the surface of the silicon nitride 603. Then, as shown in FIG. 6G, the surface of the silicon oxide 606 is planarized, making the surface of the silicon nitride 603 exposed, so that the surface of the silicon oxide 606 within the trench 604 and the surface of the silicon nitride 603 are made flush with each other. Subsequently, as shown in FIG. 6H, the silicon nitride 603 is removed. As a result of this, a device isolation film made of the silicon oxide 606 is formed. Thereafter, the pad oxide 602 is removed, a well 610 is formed in the silicon substrate 601 as shown in FIG. 6I, gate oxide 607 is formed on the surface of the silicon substrate 601, and further a gate electrode 608 is formed on the gate oxide 607 and the silicon oxide 606 (device isolation film). By forming a source and a drain in the well 610, a MOS transistor can be obtained.

According to the second prior art, since the side walls 615 are formed in adjacency to end portions of the device formation region, side faces of the well 610 can be prevented from adjoining the gate electrode 608 via the thermal oxide 605 at the end portions of the device formation region. Therefore, the transistor of the device formation region is prevented from occurring the inverse narrow channel effect and kink characteristics.

However, in the first prior art, since the thermal oxide 505 for rounding the corners at the end portions of the device formation region is formed relatively thick, there is a problem that the silicon substrate 501 is consumed so that the width of the silicon substrate 501 to be used for the device formation region becomes narrow. Also, since the volume of the thermal oxide 505 formed in the trench 504 becomes about twice as much as that of consumed silicon, there is a problem that the width of the trench 504 becomes narrow. For rounding of the end portions of the device formation region, it is necessary to form the thermal oxide 505 to a specified thickness regardless of the level of the scale-down. Therefore, as the device formation region and the device isolation film decrease in width with the progress of scale-down of LSIs, decrease in width of the device formation region as well as decrease in width of the trench 504 due to the formation of the thermal oxide 505 become relatively larger, making it difficult to form devices in the device formation region, and the silicon oxide 506 becomes harder to bury into the trench 504, as further problems. Thus, with the progress of LSI scale-down, the first prior art becomes harder to apply.

Also, in the second prior art, since a deposition step for the polysilicon 613 and a thermal oxidation step for the polysilicon 613 are involved in the formation of the side walls 615, there is a problem of increased steps involved. A further problem is that the device formation region is decreased in width because of the formation of the side walls 615. Still another problem is that ensuring the width of the device formation region would cause the trench 604 to be narrower in width because of the formation of the side walls 615. Narrowed width of the trench 604 would lead to a problem that the trench 604 is further decreased in width due to a micro loading effect during the etching for increasing the depth of the trench 604. There is yet another problem that impurities would remain in the trench 604 through the deposition step and thermal oxidation step for the polysilicon 613 and the anisotropic etching step or the like, so that voids would occur in the silicon oxide 606 that has been buried within the trench 604 by CVD process. Consequently, since an attempt to implement the scale-down of the device formation region and the device isolation film along with the scale-down of LSIs would encounter difficulty in forming the device isolation film and since voids are liable to occur in the device isolation film, there is a problem that the second prior art has difficulty in implementing the scale-down of LSIs.

SUMMARY

Accordingly, a feature of the example embodiment is to provide a transistor which is capable of preventing any inverse narrow channel effect and kink characteristics, allowing the implementation of scale-down of LSIs, and yet which can be manufactured with less steps.

In order to achieve the above feature, there is provided a transistor comprising:

a device formation region provided on a semiconductor substrate;

a device isolation film which is formed of a dielectric film and which defines the device formation region;

a gate insulator formed in the device formation region; and a gate electrode which is formed on the gate insulator and which extends on the device isolation film, wherein a surface of the device isolation film on which the gate electrode extends is formed higher in a thickness direction than a surface of the gate insulator, and a thickness of the gate electrode at a boundary between the device isolation film and the gate insulator is larger than a thickness of the gate electrode at a position away from the boundary toward the gate insulator side.

According to the above transistor, the gate electrode is larger in thickness at the boundary between the device isolation film and the gate insulator than at positions away from the boundary toward the gate insulator side. Therefore, for example, by introducing the impurity into the semiconductor substrate of the device formation region via the gate electrode and the gate insulator by ion implantation process, the impurity concentration in the vicinity of the surface of the semiconductor substrate at end portions, which are portions of the device formation region adjacent to the device isolation film, can be set higher than the impurity concentration in the vicinity of the surface of the semiconductor substrate at portions of the device formation region away from the device isolation film, in a self-alignment fashion. As a result, at the end portions of the device formation region, occurrence of parasitic transistors due to local decreases in threshold voltage can be prevented, so that the inverse narrow channel effect and kink characteristics can be prevented for transistors which are made up with the source and the drain formed in the device formation region.

Such prevention effects for parasitic transistors as well as the inverse narrow channel effect and kink characteristics can be obtained by the gate electrode of the above construction. Therefore, it is no longer necessary to form the thermal oxide of large thickness in the device isolation trench in the formation of the device isolation film, as would be involved conventionally. It is also unnecessary to form side walls at boundaries between the device isolation film and the device formation region, as would be involved conventionally. Therefore, the example embodiment presented herein makes it implementable to scale down the device isolation film and the device formation region while preventing parasitic transistors as well as the inverse narrow channel effect and kink characteristics, even under the requirement for scale-down of the device isolation film and the device formation region due to the scale-down of LSIs. Further, by the gate electrode of this construction, parasitic transistors as well as the inverse narrow channel effect and kink characteristics can be prevented with simpler construction than in the prior arts.

It is noted here that a position away from the boundary toward the gate insulator side refers to a position which is on the gate insulator and which is contained in a region in which the gate electrode formed on the gate insulator is uniform in thickness in the width direction.

Also, there is provided a transistor comprising:

a device formation region provided on a semiconductor substrate;

a device isolation film which is formed of a dielectric film and which defines the device formation region;

a gate insulator formed in the device formation region; and a gate electrode which is formed on the gate insulator and which extends on the device isolation film, wherein a surface of the device isolation film on which the gate electrode extends is formed higher in a thickness direction than a surface of the gate insulator, the device isolation film has a flat portion provided inner than a boundary at which the device isolation film adjoins the gate insulator as viewed in a plan view, the flat portion being formed higher in a thickness direction than at the boundary and extending in a planar direction of the semiconductor substrate, and a height difference A between a surface of the device isolation film, on which the gate electrode extends, and a surface of the gate insulator, a widthwise distance B from an end of the flat portion of the device isolation film to the boundary, and a thickness D of the gate electrode of the device formation region satisfy following Equations (1) and (2):

$$D > B \quad (1)$$

$$A/D + (1 - (B/D)^2)^{0.5} > 1 \quad (2).$$

According to the above transistor, the gate electrode is so formed that a thickness of the gate electrode at the boundary between the device isolation film and the gate insulator is larger than a thickness of the gate electrode on the gate insulator in the device formation region. The device isolation film, having the flat portion, has a step portion in the vicinity of the boundary of the device isolation film with the gate insulator, the step portion being lower in height in the thicknesswise direction than the flat portion. Since the height difference A between the surface of the device isolation film, on which the gate electrode extends, and the surface of the gate insulator, the widthwise distance B from the end of the flat portion of the device isolation film to the boundary, and the thickness D of the gate electrode of the device formation region satisfy the Equations (1) and (2), the gate electrode increases in thickness at the boundary than on the gate insulator. Therefore, for example, by introducing the impurity into the semiconductor substrate of the device formation region via the gate electrode and the gate insulator by ion implantation process, the impurity concentration in the vicinity of the surface of the semiconductor substrate at end portions, which are portions of the device formation region adjacent to the device isolation film, can be set higher than the impurity concentration in the vicinity of the surface of the semiconductor substrate at portions of the device formation region far from the device isolation film, in a self-alignment fashion. As a result, at the end portions of the device formation region, occurrence of parasitic transistors due to local decreases in threshold voltage can be prevented, so that the inverse narrow channel effect and kink characteristics can be prevented for transistors which are made up with the source and the drain formed in the device formation region.

Such prevention effects for parasitic transistors as well as the inverse narrow channel effect and kink characteristics can be obtained when the Equations (1) and (2) is satisfied by the height difference A between the surface of the device isolation film, on which the gate electrode extends, and the surface of the gate insulator, the widthwise distance B from the end of the flat portion of the device isolation film to the boundary, and the thickness D of the gate electrode of the device formation region. Therefore, it is no longer necessary to form the thermal oxide of large thickness in the device isolation trench in the formation of the device isolation film, as would be involved conventionally. It is also unnecessary to form side walls at boundaries between the device isolation film and the device formation region, as would be involved conventionally. Therefore, the example embodiment presented herein makes it implementable to scale down the device isolation film and the device formation region while preventing parasitic transistors as well as the inverse narrow channel effect and kink characteristics, even under the requirement for scale-down of the device isolation film and the device formation region due to the scale-down of LSIs. Further, parasitic transistors as well as the inverse narrow channel effect and kink characteristics can be prevented with simpler construction than in the prior arts.

In one embodiment, an impurity is added in a vicinity of the surface of the semiconductor substrate in the device formation region so that the device formation region has concentrations higher in its portions closer to the device isolation film than in its portions farther from the device isolation film.

According to the above embodiment, occurrence of parasitic transistors due to local decreases in threshold voltage can be prevented at end portions of the device formation region. Therefore, the inverse narrow channel effect and kink characteristics can be prevented for transistors which are made up with the source and the drain formed in the device formation region.

It is noted here that with respect to the semiconductor substrate of the device formation region, a portion far from the device isolation film refers to a portion contained in a region where the gate electrode on the semiconductor substrate has a uniform thickness in the width direction, while a portion close to the device isolation film refers to a portion contained in a region where the gate electrode on the semiconductor substrate has a thickness larger than the uniform thickness.

Also, there is provided a transistor manufacturing method comprising the steps of:

forming first oxide on a semiconductor substrate;

forming nitride on the first oxide;

forming a trench which extends through the nitride and the first oxide to reach the semiconductor substrate;

forming second oxide on a surface of the semiconductor substrate exposed to the trench;

forming a first dielectric film which buries the trench and which has a surface substantially flush with a surface of the nitride;

removing the nitride and the first oxide so that the surface of the semiconductor substrate is exposed;

forming a second dielectric film on the exposed surface of the semiconductor substrate;

forming an electrically conductive layer on the first dielectric film and the second dielectric film so that following Equations (3) and (4) are satisfied; and a first impurity addition step for introducing an impurity into the semiconductor substrate via the conductive layer and the second dielectric film by ion implantation process:

$$D > B \tag{3}$$

$$A/D + (1-(B/D)^2)^{0.5} > 1 \tag{4}$$

where A represents a height difference between a surface of the first dielectric film, on which the conductive layer extends, and a surface of the second dielectric film, B represents a widthwise distance from a boundary at which the first dielectric film adjoins the second dielectric film, to an end of a flat portion which is provided inner than the boundary as viewed in a plan view and which is formed higher in a thickness direction than at the boundary and extending in a planar direction, and D represents a thickness of the conductive layer on the second dielectric film.

According to the above manufacturing method, the conductive layer is so formed that the height difference A between the surface of the first dielectric film, on which the conductive layer extends, and the surface of the second dielectric film, the widthwise distance B from the end of the flat portion of the first dielectric film to the boundary with the second dielectric film, and the thickness D of the conductive layer on the second dielectric film satisfy the Equations (3) and (4). As a result of this, in the first impurity addition step, with regard to the semiconductor substrate located under the second dielectric film, the impurity concentration in the vicinity of the surface of the semiconductor substrate at end portions, which are portions adjacent to the first dielectric film, becomes higher than the impurity concentration in the vicinity of the surface of the semiconductor substrate at portions far from the first dielectric film, in a self-alignment fashion. As a result, at the end portions of the semiconductor substrate, occurrence of parasitic transistors due to local decreases in threshold voltage can be prevented, so that the inverse narrow channel effect and kink characteristics can be prevented for transistors which are made up with the source and drain formed in the semiconductor substrate under the second dielectric film.

In one embodiment, the manufacturing method further comprises a second impurity addition step for introducing an impurity into the semiconductor substrate by an ion implantation process which differs from the ion implantation process of the first impurity addition step in at least one of implantation energy, impurity implantation amount and impurity.

In this embodiment, by the second impurity addition step, for example, a well region can be formed in the semiconductor substrate.

BRIEF DESCRIPTION OF THE DRAWINGS

The example embodiment presented herein will become more fully understood from the detailed description given hereinbelow and the accompanying drawings which are given by way of illustration only, and thus are not intended to limit the example embodiment, and wherein.

DETAILED DESCRIPTION OF THE INVENTION

Hereinbelow, the present technology will be described in detail by way of embodiments thereof illustrated in the accompanying drawings.

FIGS. 1A to 1K are views showing steps of a transistor manufacturing method according to an embodiment.

A transistor manufactured by this manufacturing method is a MOS transistor formed in a well region of a silicon substrate.

Figure 1A:
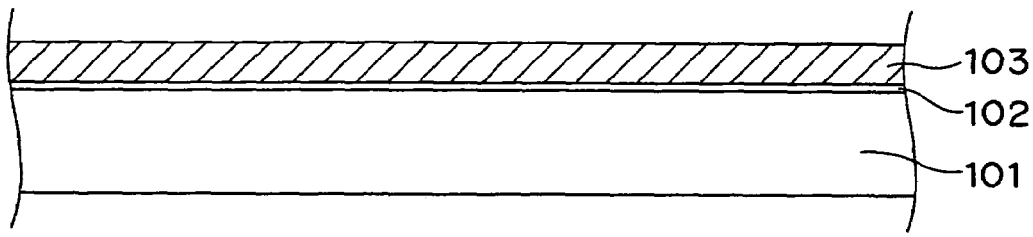
FIG. 1A is a view showing a step of a transistor manufacturing method as an embodiment of the invention.

First, as shown in FIG. 1A, pad oxide 102 made of 8 nm thick silicon oxide is formed on a silicon substrate 101 by oxidation process. Also, 140 nm thick silicon nitride 103 is formed on the pad oxide 102 by CVD process. A thickness of this silicon nitride 103 determines a height A of a later-described device isolation film 110 from the surface of gate oxide 112. Therefore, with a prediction of a decrement of the thickness of the device isolation film 110 resulting from execution of later-described steps of FIGS. 1B to 1G, the thickness of the silicon nitride 103 is so set that the height of the device isolation film 110 becomes a specified height in the formation of a gate electrode 114 in the step of FIG. 1H.

Figure 1B:
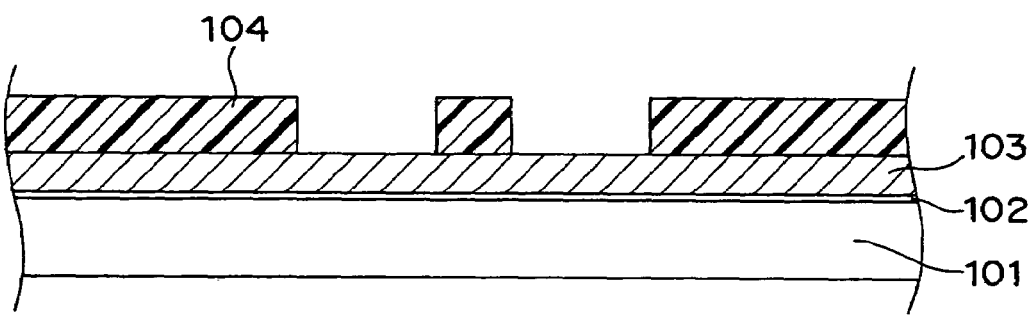
FIG. 1B is a view showing a step subsequent to FIG. 1A.

Subsequently, as shown in FIG. 1B, photoresist 104 having openings at positions where the device isolation film is to be formed is formed.

Figure 1C:
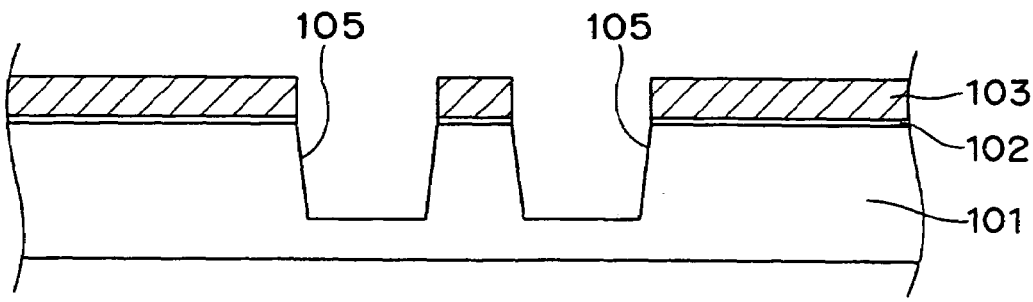
FIG. 1C is a view showing a step subsequent to FIG. 1B.

After that, as shown in FIG. 1C, with the photoresist 104 used as a mask, portions of the silicon nitride 103, the pad oxide 102 and the silicon substrate 101 are etched by RIE process, by which device isolation trenches 105 having a depth of 150 nm from the surface of the silicon nitride 103 are formed. Subsequently, the photoresist 104 is removed.

Figure 1D:
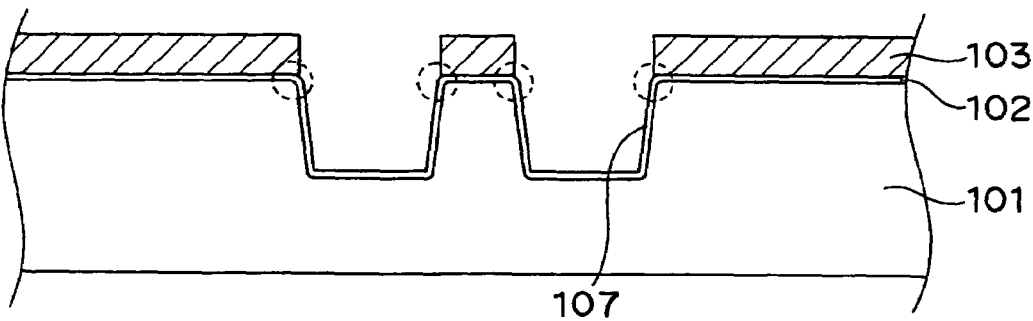
FIG. 1D is a view showing a step subsequent to FIG. 1C.

Then, as shown in FIG. 1D, 20 nm thick silicon oxide 107 is formed on the surface of the silicon substrate 101 exposed to the device isolation trenches 105 by oxidation process. By virtue of this process, any damage layer due to the etching process can be removed, and moreover the cross-sectional configurations of ends of a portion intended for a device formation region of the silicon substrate 101 (i.e., portions surrounded by broken line circles in the sectional view of FIG. 1D, which are close and adjacent to the silicon nitride 103 and close to side faces of the device isolation trenches 105 on the silicon substrate 101) can be made rounded ones. It is noted that the cross-sectional configurations of the corner portions of the silicon substrate 101 may be other than rounded ones.

Figure 1E:
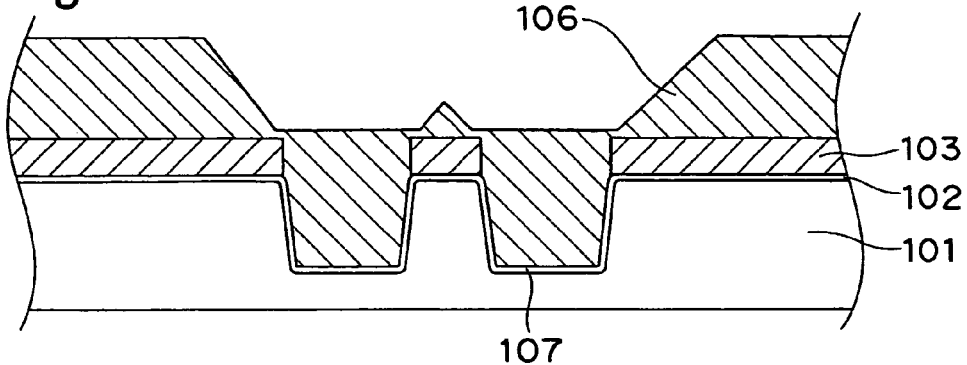
FIG. 1E is a view showing a step subsequent to FIG. 1D.

Subsequently, as shown in FIG. 1E, silicon oxide 106 is deposited on the surface of the silicon nitride 103 and within the device isolation trenches 105 by CVD process. The silicon nitride 106 is deposited to a thickness of 350 nm at a maximum on the surface of the silicon nitride 103.

Figure 1F:
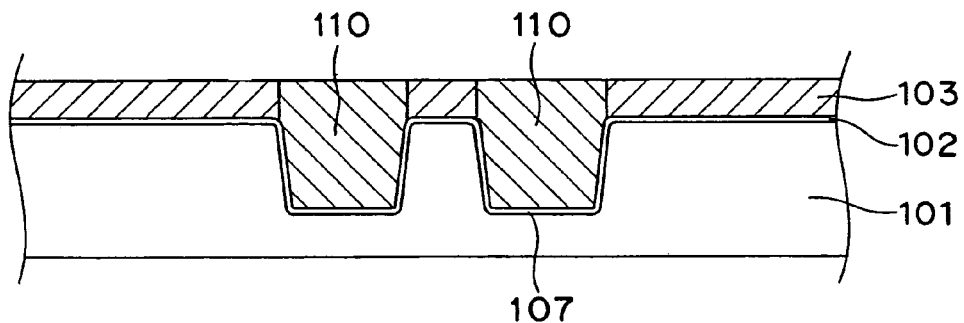
FIG. 1F is a view showing a step subsequent to FIG. 1E.

Subsequently, as shown in FIG. 1F, the silicon oxide 106 is polished by CMP process so that the surface of the silicon oxide 106 within the device isolation trenches 105 and the surface of the silicon nitride 103 are made flush with each other. In this process, the silicon nitride 103 serves as a stopper for polishing. As a result, a device isolation film 110 is formed of the silicon oxide 106 within the device isolation trenches 105.

Figure 1G:
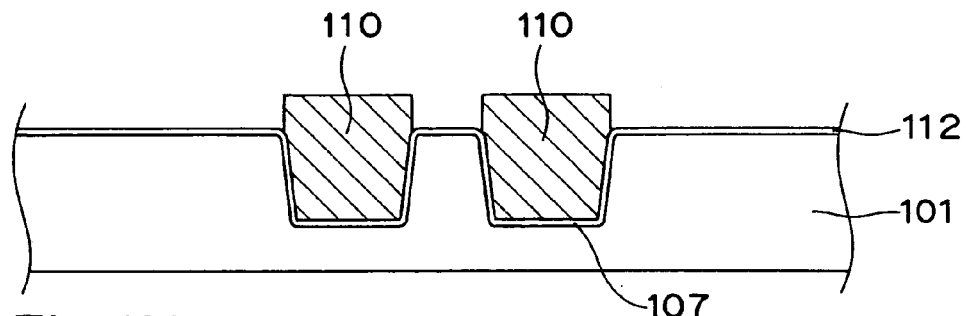
FIG. 1G is a view showing a step subsequent to FIG. 1F.
Figure 4:
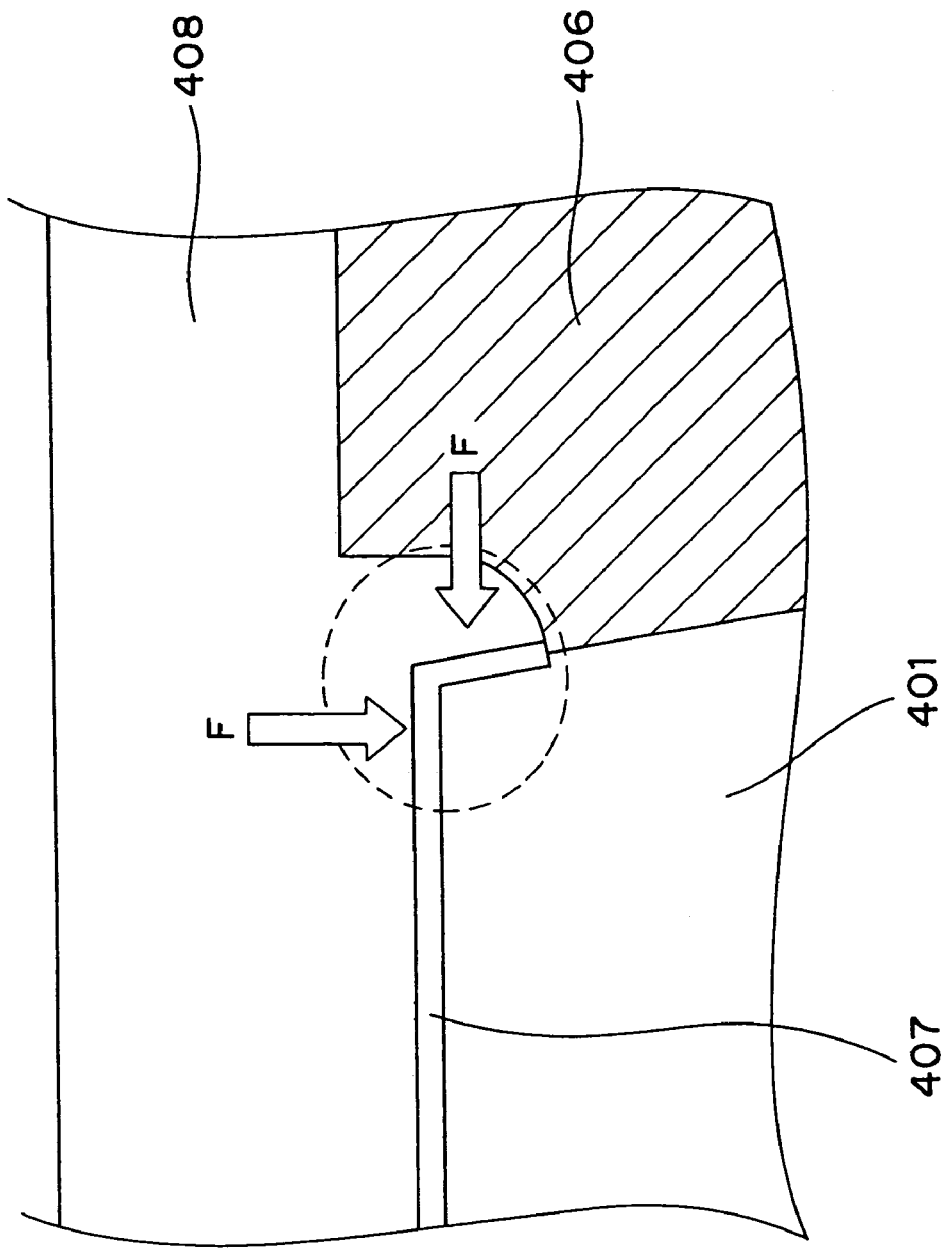
FIG. 4 is a sectional view showing an end portion of a device formation region according to a prior art.
Figure 5A:
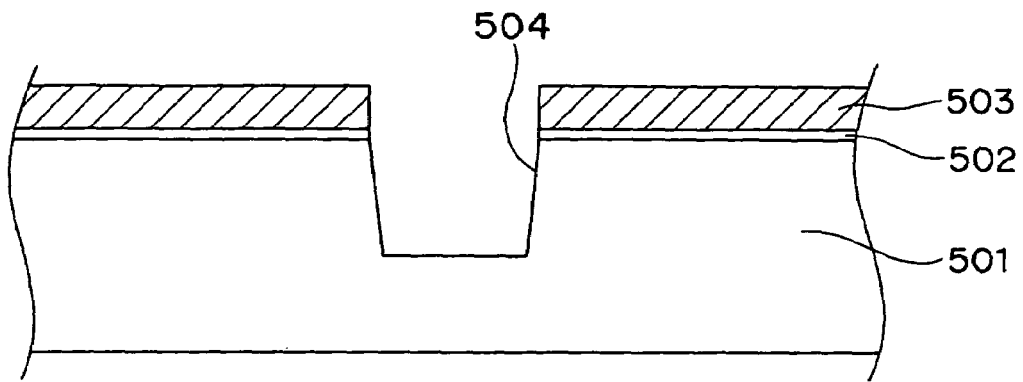
FIG. 5A is a view showing a step of a transistor manufacturing method according to a first prior art.
Figure 5B:
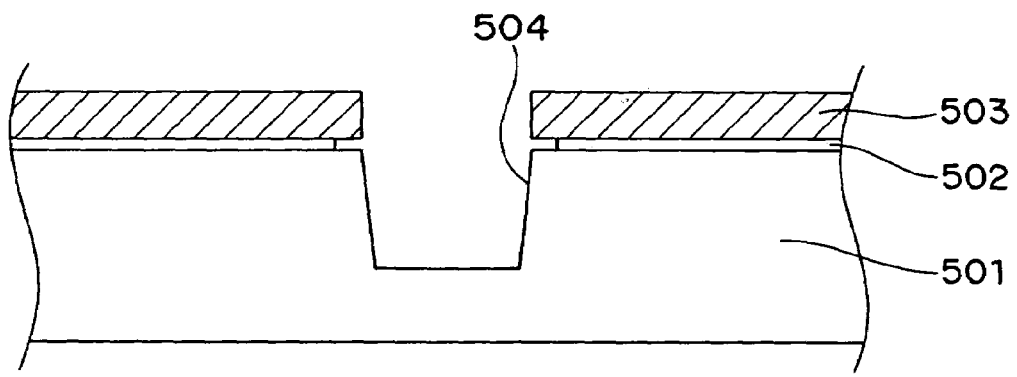
FIG. 5B is a view showing a step subsequent to FIG. 5A.
Figure 5C:
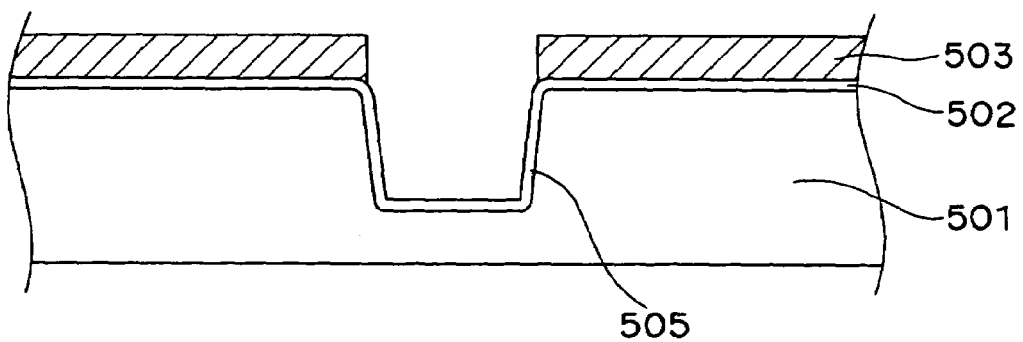
FIG. 5C is a view showing a step subsequent to FIG. 5B.
Figure 5D:
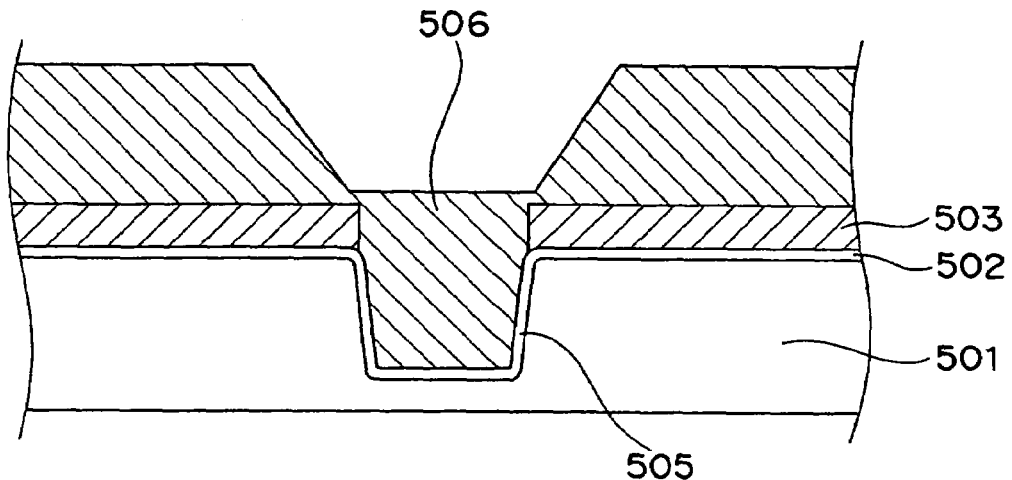
FIG. 5D is a view showing a step subsequent to FIG. 5C.
Figure 5E:
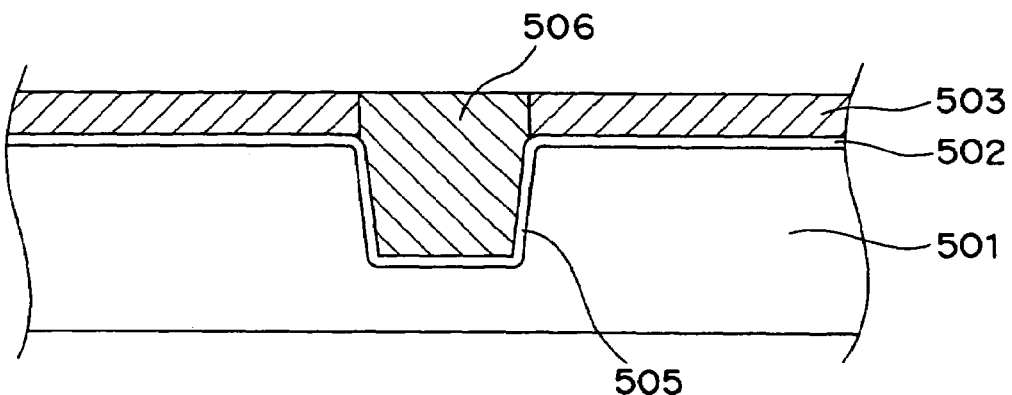
FIG. 5E is a view showing a step subsequent to FIG. 5D.
Figure 5F:
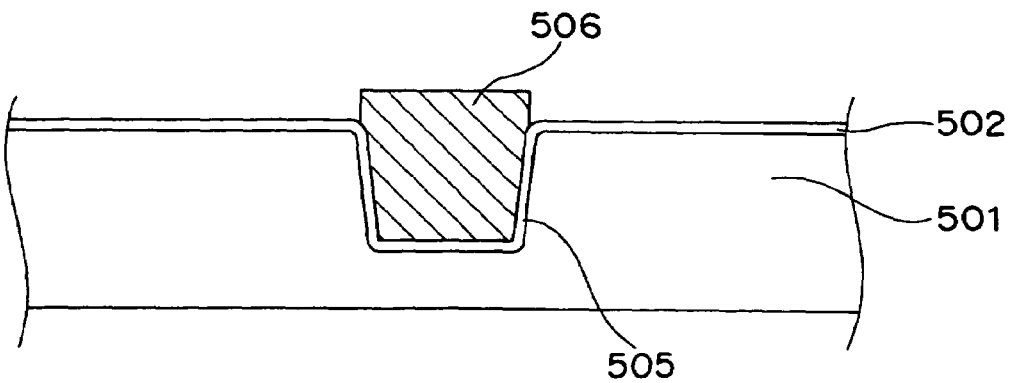
FIG. 5F is a view showing a step subsequent to FIG. 5E.
Figure 6A:
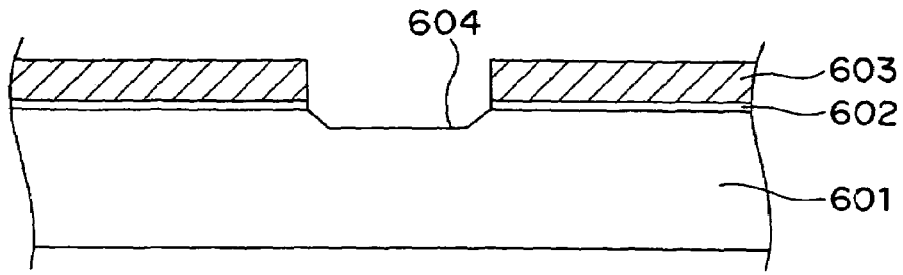
FIG. 6A is a view showing a step of a transistor manufacturing method according to a second prior art.
Figure 6B:
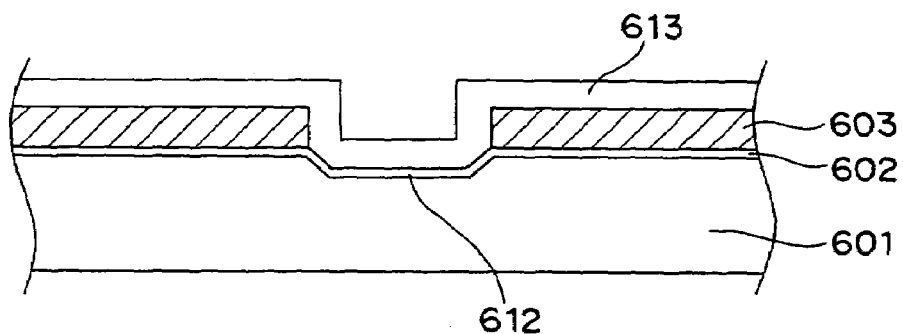
FIG. 6B is a view showing a step subsequent to FIG. 6A.
Figure 6C:
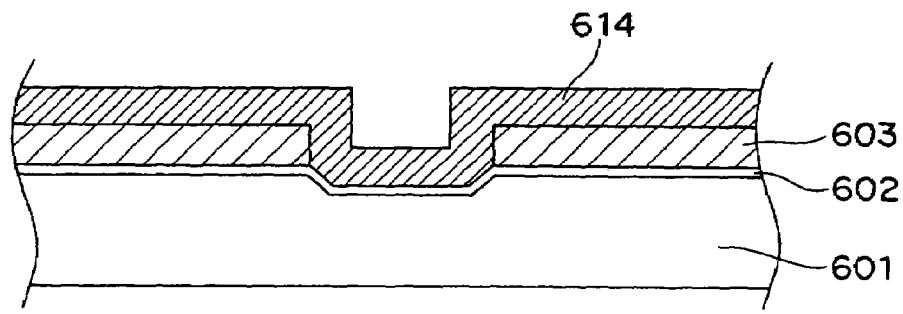
FIG. 6C is a view showing a step subsequent to FIG. 6B.
Figure 6D:
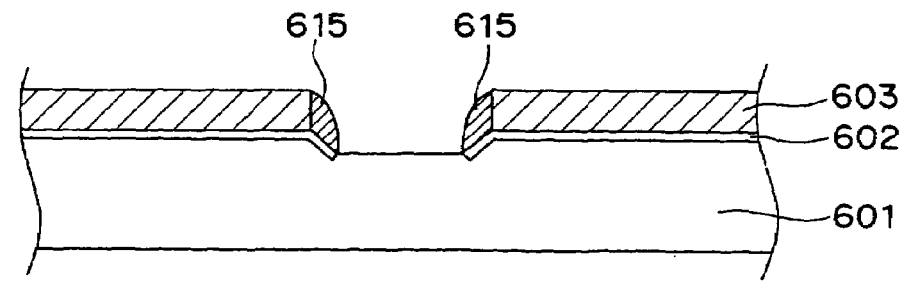
FIG. 6D is a view showing a step subsequent to FIG. 6C.
Figure 6E:
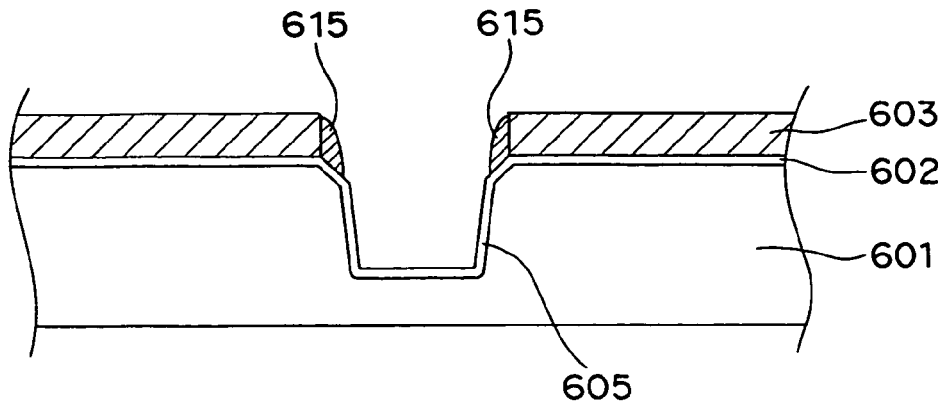
FIG. 6E is a view showing a step subsequent to FIG. 6D.
Figure 6F:
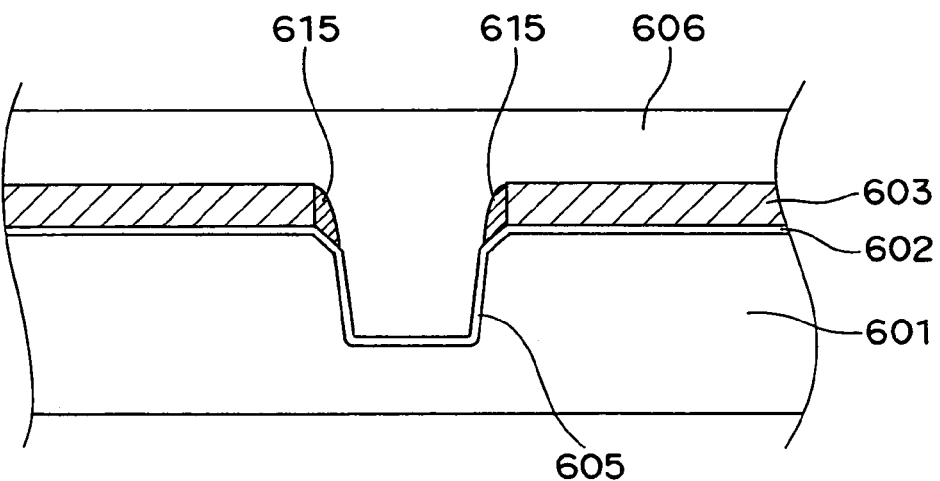
FIG. 6F is a view showing a step subsequent to FIG. 6E.
Figure 6G:
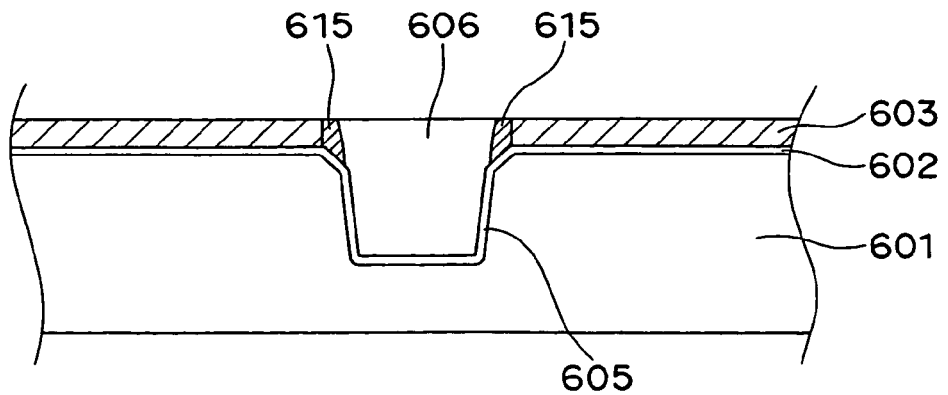
FIG. 6G is a view showing a step subsequent to FIG. 6F.
Figure 6H:
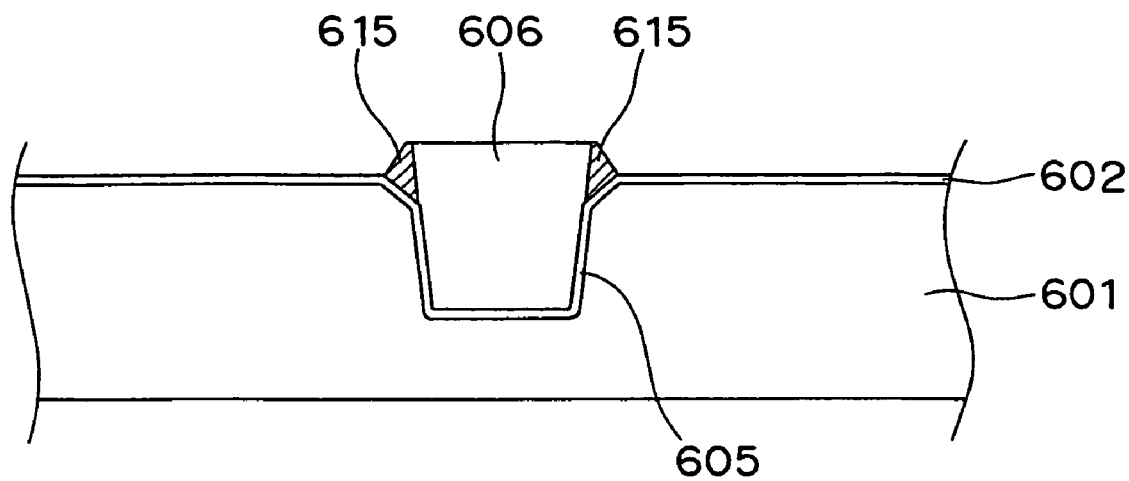
FIG. 6H is a view showing a step subsequent to FIG. 6G.
Figure 6I:
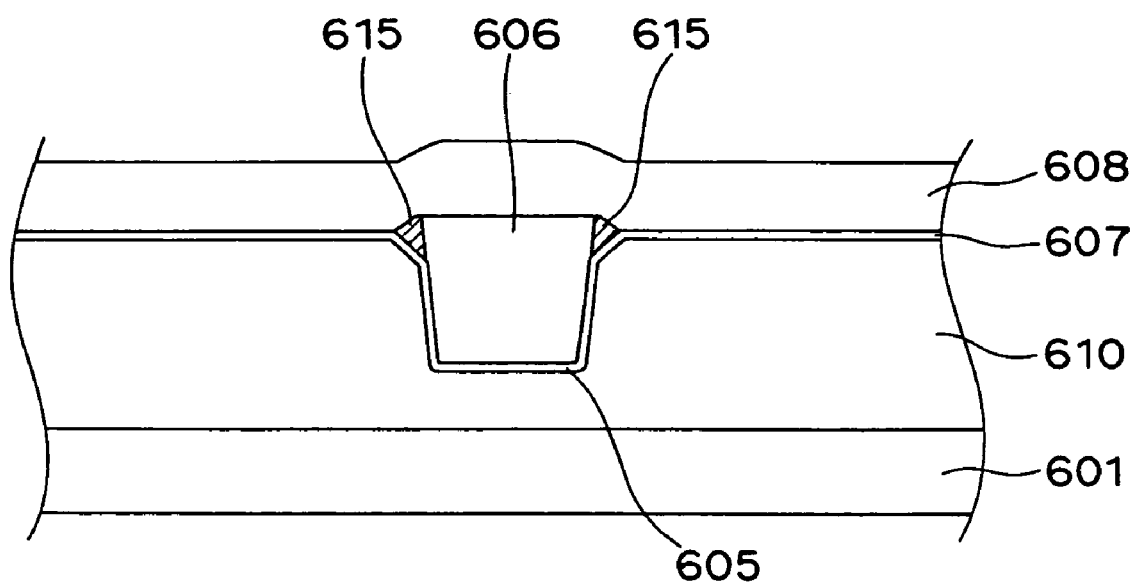
FIG. 6I is a view showing a step subsequent to FIG. 6H.

Subsequently, the silicon nitride 103 is removed by wet etching using phosphoric acid so that the surface of the pad oxide 102 is exposed. This pad oxide 102 is removed by wet etching using hydrofluoric acid so that the surface of the silicon substrate 101 is exposed. In the wet etching process in this case, since the material of the device isolation film 110 is also etched, the exposed surface and side walls of the device isolation film 110 are moved back. Then, as shown in FIG. 1G, 4 nm thick gate oxide 112 serving as a gate insulator is formed on the surface of the silicon substrate 101 by oxidation process.

Although not shown, sacrifice oxide may be formed by oxidation process for removal of any damage of the surface of the silicon substrate 101 that has resulted during the formation of the device isolation trenches 105 as well as for rounding of the corner portions of the silicon substrate 101 forming part of the device formation region, in which case the gate oxide 112 is to be formed after the sacrifice oxide has been removed by wet etching using hydrofluoric acid.

Figure 1H:
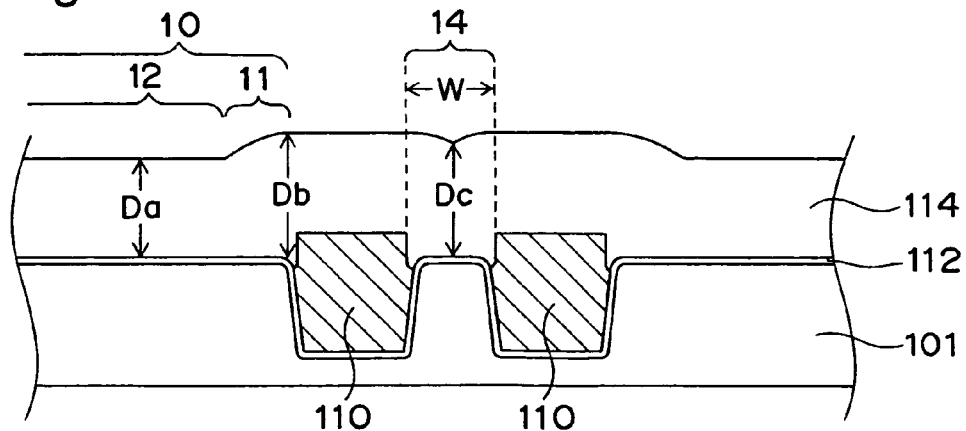
FIG. 1H is a view showing a step subsequent to FIG. 1G.

Subsequently, as shown in FIG. 1H, a gate electrode film 114 is formed on the gate oxide 112 and the device isolation film 110. In this embodiment, a polysilicon film is deposited to a thickness of 155 nm by LP-CVD (Low Pressure-Chemical Vapor Deposition) process. The material of this gate electrode 114 may be an electrically conductive material such as polysilicon or amorphous silicon. In FIG. 1H, the region extending from a boundary between the gate oxide 112 and the device isolation film 110 toward one side where the gate oxide 112 is formed is a device formation region 10.

A detailed description as to the thickness of the gate electrode 114 will be given below with reference to FIG. 2.

Figure 2:
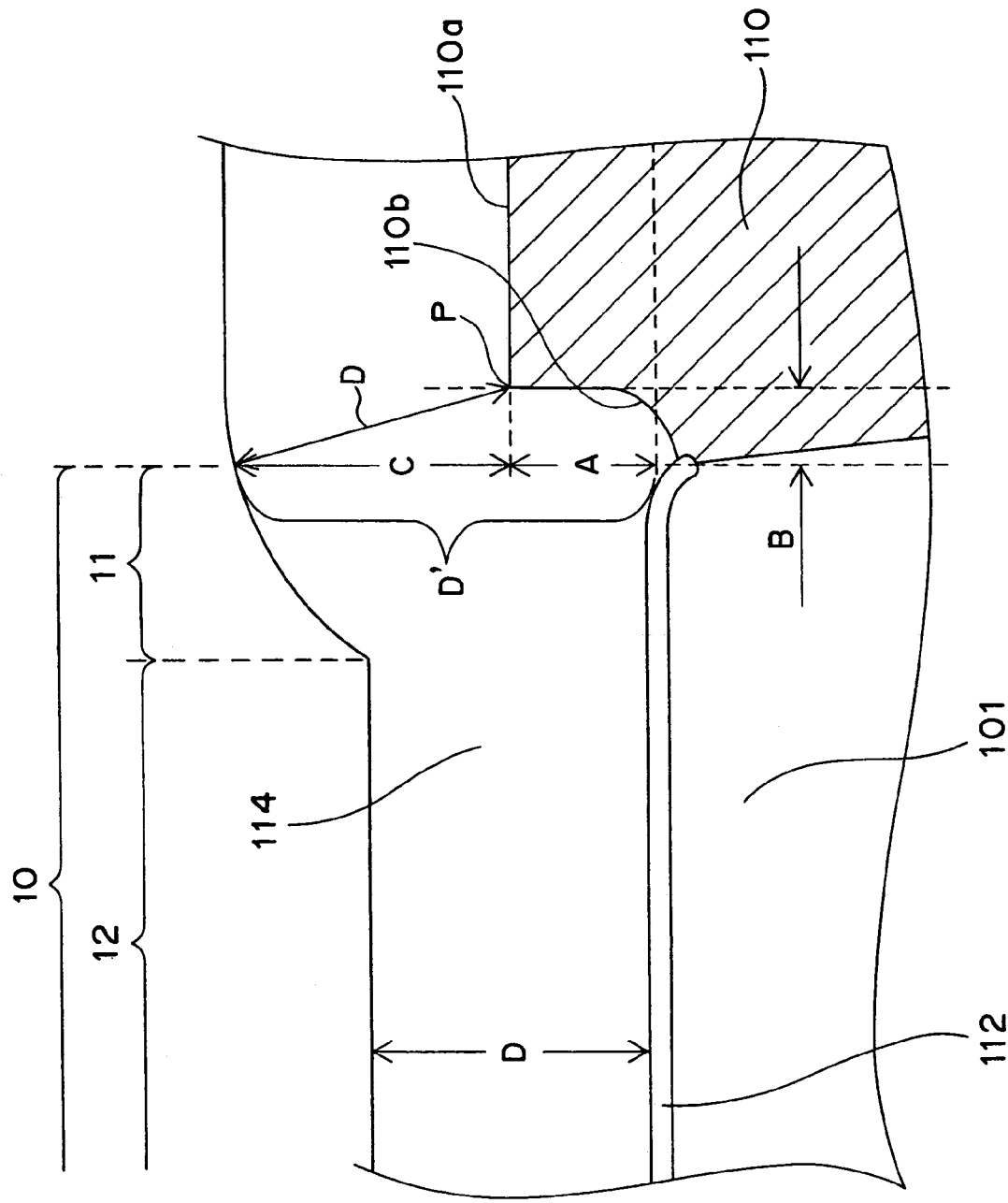
FIG. 2 is an enlarged sectional view showing a vicinity of an end portion of a device formation region.

FIG. 2 is an enlarged sectional view showing a vicinity of an end portion 11 of the device formation region 10 defined by the device isolation film 110. In this end portion 11 of the device formation region, the gate oxide 112 is formed on the surface of the silicon substrate 101. Also, the device isolation film 110 adjoins the side face of the silicon substrate 101 via the silicon oxide 107. It is noted that the silicon oxide 107 is omitted in FIG. 2.

A portion of the device isolation film 110 adjoining the gate oxide 112 of the device formation region 10 is generally flush with the gate oxide 112. Meanwhile, a surface of the device isolation film 110 located inner than the boundary as viewed in a plan view is higher than the boundary and forms a flat portion 110a generally parallel to the surface of the silicon substrate 101. Between the boundary of the device isolation film 110 and the flat portion 110a is formed a step portion 110b that increases in height from the boundary toward the flat portion 110a.

Referring to FIG. 2, a height difference between the device isolation film 110 and the gate oxide 112 of the device formation region 10 is assumed as A. Also, a widthwise distance from the boundary between the gate oxide 112 and the device isolation film 110 to an end of the flat portion of the device isolation film 110, i.e., a width of the step portion 110b is assumed as B. Further, a thickness of a portion (hereinafter, referred to as uniform portion) which is located away from the boundary of the gate oxide 112 and which has an uniform thickness on the gate oxide 112 is assumed as D. It is noted that the thickness of the gate electrode 114 on the gate oxide 112 and on the flat portion 110a of the device isolation film 110 is D and of the same.

When forming the polysilicon gate electrode 114 with CVD process, silicon, which is the material of the electrode, grows in the vicinity of a center of the flat portion 110a of the device isolation film 110 so as to form a parallel surface to the flat portion 110a. Meanwhile, at an end of the flat portion 110a of the device isolation film 110, a corner P is formed between the flat portion 110a and the step portion 110b, where silicon grows around the corner P to form a surface having a generally circular-arc shaped cross section. Therefore, in the vicinity of the boundary between the gate oxide 112 and the device isolation film 110, the surface of the gate electrode 114 is generally circular-arc shaped around the corner P of the device isolation film 110. Thus, a thickness D' of the gate electrode 114 at the boundary is equal to a sum of a height difference A between the surface of the gate oxide 112 and the surface of the device isolation film 110 and a height difference C from the surface of the flat portion 110a of the device isolation film to the surface of the gate electrode 114 at the boundary position. That is, the thickness D' can be expressed as the following Equation (5). It is noted that although the surface of the gate oxide 112 is rounded in the vicinity of the boundary between the surface of the gate oxide 112 and the device isolation film 110, yet increase in the thickness of the gate electrode 114 due to the roundness is minute and therefore not taken into consideration.

$$D'=A+C \quad (5)$$

When the thickness D of the uniform portion of the gate electrode 114 is larger than the width B of the step portion 110b of the device isolation film, i.e., when the thickness D satisfies the following Equation (6), a thickness C of the gate electrode 114 at the boundary between the gate oxide 112 and the device isolation film 110 can be approximated as expressed by the following Equation (7) because the surface of the gate electrode 114 at the boundary is located on a circular arc having a radius of D around the corner P at the end of the flat portion 11a of the device isolation film:

$$D>B \quad (6)$$

$$C=(D^2-B^2)^{0.5} \quad (7)$$

In this case, substituting Equation (7) into Equation (5) results in the following Equation (8):

$$D'=A+(D^2-B^2)^{0.5} \quad (8)$$

In this connection, the thickness D' of the gate electrode 114 at the boundary between the gate oxide 112 and the device isolation film 110 needs to be larger than the thickness D of the uniform portion of the gate electrode 114. Therefore, the following Equation (9) has to be satisfied:

$$A+(D^2-B^2)^{0.5}>D \quad (9)$$

Dividing both sides of this Equation (9) by D yields the following Equation (10):

$$A/D + (1-(B/D)^2)^{0.5} > 1 \qquad (10)$$

With the aim of satisfying this Equation (10), the height A of the device isolation film 110 from the surface of the gate oxide 112, the height A being determined depending on the thickness of the silicon nitride 103 to be formed in the step of FIG. 1A and the extent of retreat of the device isolation film 110 surface in the wet etching of the pad oxide 102, as well as the thickness D of the uniform portion of the gate electrode 114, are set. Also, since the step portion 110b of the device isolation film is formed in the wet etching of the silicon nitride 103 in the step of FIG. 1G, the width B of the step portion 110b is specifically determined from the conditions of the wet etching. Setting those parameters A, B and D as shown above allows the thickness D' of the gate electrode 114 at the boundary to be formed to a proper thickness. As a result, impurity concentrations of a later-described profile can be obtained in the silicon substrate 101.

In the above Equation (10), an increase in its left side means an increase in the thickness D' of the gate electrode at the end of the device formation portion, i.e., the boundary between the gate oxide 112 and the device isolation film 110 relative to the thickness D of the uniform portion of the gate electrode. In this connection, the smaller the thickness D of the uniform portion of the gate electrode 114 is relative to the step gap A between the surface of the device isolation film 110 and the surface of the gate oxide 112, the larger the left side becomes. On the other hand, the larger the thickness D of the uniform portion of the gate electrode 114 is relative to the width B of the step portion 110b of the device isolation film, the larger the left side becomes. Accordingly, based on the step gap A between the device isolation film 110 and the gate oxide 112 and the width B of the step portion 110b of the device isolation film, a range of the thickness D of the uniform portion of the gate electrode 114 can be determined wherein the thickness D' of the gate electrode 114 at the boundary is larger than the thickness D. That is, by setting the thickness D of the uniform portion of the gate electrode 114 within a range that satisfies Equations (6) and (10), the thickness D' of the gate electrode 114 at the boundary can be made larger than the thickness D of the gate electrode 114 in the uniform portion.

More specifically, in this embodiment, the height A between the surface of the device isolation film 110 and the surface of the gate oxide 112 is set to 65 nm, the width B of the step portion 110b of the device isolation film is set to 40 nm, and the thickness D of the uniform portion of the gate electrode 114 is set to 155 nm. These values satisfy the Equations (6) and (10). Therefore, the thickness D' of the gate electrode 114 at the boundary between the device isolation film 110 and the gate oxide 112 can be made larger than 155 nm.

Thus, referring to FIG. 1H, a thickness Db at the boundary between the device isolation film 110 and the gate oxide 112, i.e., at the end of the device formation region 10, is made larger than a thickness Da of the uniform portion of the gate electrode 114 on the gate oxide 112.

Further, referring to FIG. 1H, in a device formation region 14 (hereinafter, referred to as narrow width region) sandwiched by two device isolation films 110, if a width W of the narrow width region 14 is less than double the thickness Da of the uniform portion of the gate electrode 114, then a thickness Dc of the gate electrode 114 deposited on the region becomes larger than the thickness Da of the uniform portion. This is because the material of the gate electrode 114 is deposited on the narrow width region 14 so as to form a surface parallel to the gate oxide 112 and moreover so deposited as to form a circular-arc shaped surface around the corner P of the flat portion 110a of the device isolation films. Accordingly, the thickness Dc of the gate electrode 114 to be formed in the narrow width region 14 sandwiched by the two device isolation films 110 becomes thicker increasingly with decreasing width W of the narrow width region 14. It is noted that the width W of the device formation region is a distance between the mutually facing corners P of each flat portion 110a of two device isolation films 110.

More specifically, in this embodiment, when the thickness Da of the flat portion of the gate electrode 114 is 155 nm and the distance W between the two device isolation films 110 is 200 nm, then the thickness Dc of the gate electrode 114 at a center portion on the narrow width region 14 sandwiched by the two device isolation films 110 becomes 185 nm, which is thicker than the thickness Da of the uniform portion of the gate electrode 114.

Figure 1I:
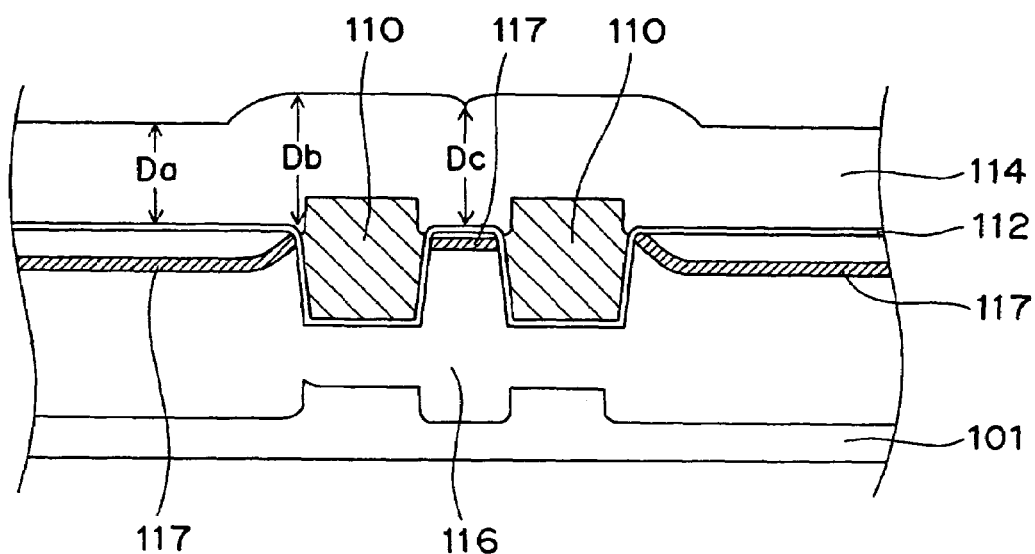
FIG. 1I is a view showing a step subsequent to FIG. 1H.

Next, as shown in FIG. 1I, impurities are introduced into the silicon substrate 101 via the gate electrode 114 and the gate oxide 112 by ion implantation process. The impurities to be introduced into the silicon substrate 101 are, for example, boron for the region where an NMOS transistor is formed, and phosphorus for the region where a PMOS transistor is formed. By the introduction of the impurities, a well 116 and a threshold adjustment impurity layer 117 are formed on the silicon substrate.

Preferably, the introduction of impurities into the silicon substrate 101 is performed by two to four times of ion implantation under a plurality of conditions in which implantation energy and ion implantation amount are varied.

More specifically, in the NMOS transistor formation region, a first ion implantation is performed with boron as an impurity under the conditions of an implantation energy of 215 KeV, an implantation amount of $1.0 \times 10^{13}$ cm$^{-2}$ and an implantation angle of 0°. Also, a second ion implantation is performed with boron as an impurity under the conditions of an implantation energy of 72 KeV, an implantation amount of $8.0 \times 10^{12}$ cm$^{-2}$ and an implantation angle of 0°.

The first ion implantation is purposed for formation of the well 116, by which an impurity introduction region having a concentration peak at a depth of about 230 nm from the surface of the silicon substrate 101 can be obtained. This first ion implantation corresponds to the second impurity addition step of the example embodiment.

Meanwhile, the second ion implantation is purposed for formation of the threshold adjustment region 117 for adjusting the threshold voltage of the transistor. This second ion implantation corresponds to the first impurity addition step of the example embodiment. The threshold adjustment region 117 has a concentration peak at a depth of about 5 nm from the surface of the silicon substrate 101 in the end portion 11 of the device formation region. Also, in this end portion 11 of the device formation region, the impurity concentration of the surface of the silicon substrate 101 becomes about $4.8 \times 10^{17}$ pcs/cm$^{-3}$. Meanwhile, in a portion (hereinafter, referred to as electrode uniform portion) 12 of the device formation region corresponding to the region where the gate electrode 114 is formed to a uniform thickness Da, the threshold adjustment region 117 has a concentration peak at a depth of about 65 nm from the surface of the silicon substrate 101. Also, in this electrode uniform portion 12 of the device formation region, the impurity concentration of the surface of the silicon substrate 101 becomes about $2.8 \times 10^{17}$ pcs/cm$^{-3}$. This is because the thickness of the gate electrode 114 on the device formation region 10 differs between the end portion 11 and the uniform portion 12. That is, while the thickness Db of the gate electrode 114 is 215 nm in the end portion 11 of the device formation region, the uniform thickness Da of the gate electrode 114 in the electrode uniform portion 12 of the device formation region is 155 nm. In response to this thickness difference of the gate electrode 114, the threshold adjustment region 117 is formed so as to have a peak of impurity concentration at a depth of about 5 nm in the end portion 11 of the device formation region, while the threshold adjustment region 117 is formed so as to have a peak of impurity concentration at a depth of about 65 nm in the electrode uniform portion 12 of the device formation region. That is, between the end portion 11 and the electrode uniform portion 12 of the device formation region, there occurs a difference in depth of the peak of impurity concentration of the threshold adjustment region 117 generally equal to the thickness difference of the gate electrode formed at each of the individual portions.

As shown above, by setting the impurity concentration in portions of the silicon substrate 101 close to its surface so as to be larger in the end portion 11 than in the electrode uniform portion 12 of the device formation region, the threshold voltage of the transistor formed at the end portion 11 of the device formation region can be increased. Therefore, parasitic transistors which have conventionally occurred in the end portion 11 of the device formation region as well as the inverse narrow channel effect and kink characteristics resulting when the transistor is formed at that portion can be prevented.

Also, the narrow width region 14 between the two device isolation films 110 is so formed that the thickness Dc of the gate electrode 114 on the narrow width region 14 is larger than the thickness Da of the gate electrode on the electrode uniform portion 12 of the device formation region. Therefore, the threshold adjustment region 117 formed in the silicon substrate 101 is shallower in depth in the narrow width region 14 than in the electrode uniform portion 12. Also, the impurity concentration of the silicon substrate 101 surface is higher in the narrow width region 14 than in the electrode uniform portion 12. As a consequence, parasitic transistors can be prevented in the narrow width region 14, and moreover the inverse narrow channel effect and kink characteristics of transistors formed in this region can be prevented.

Figure 3:
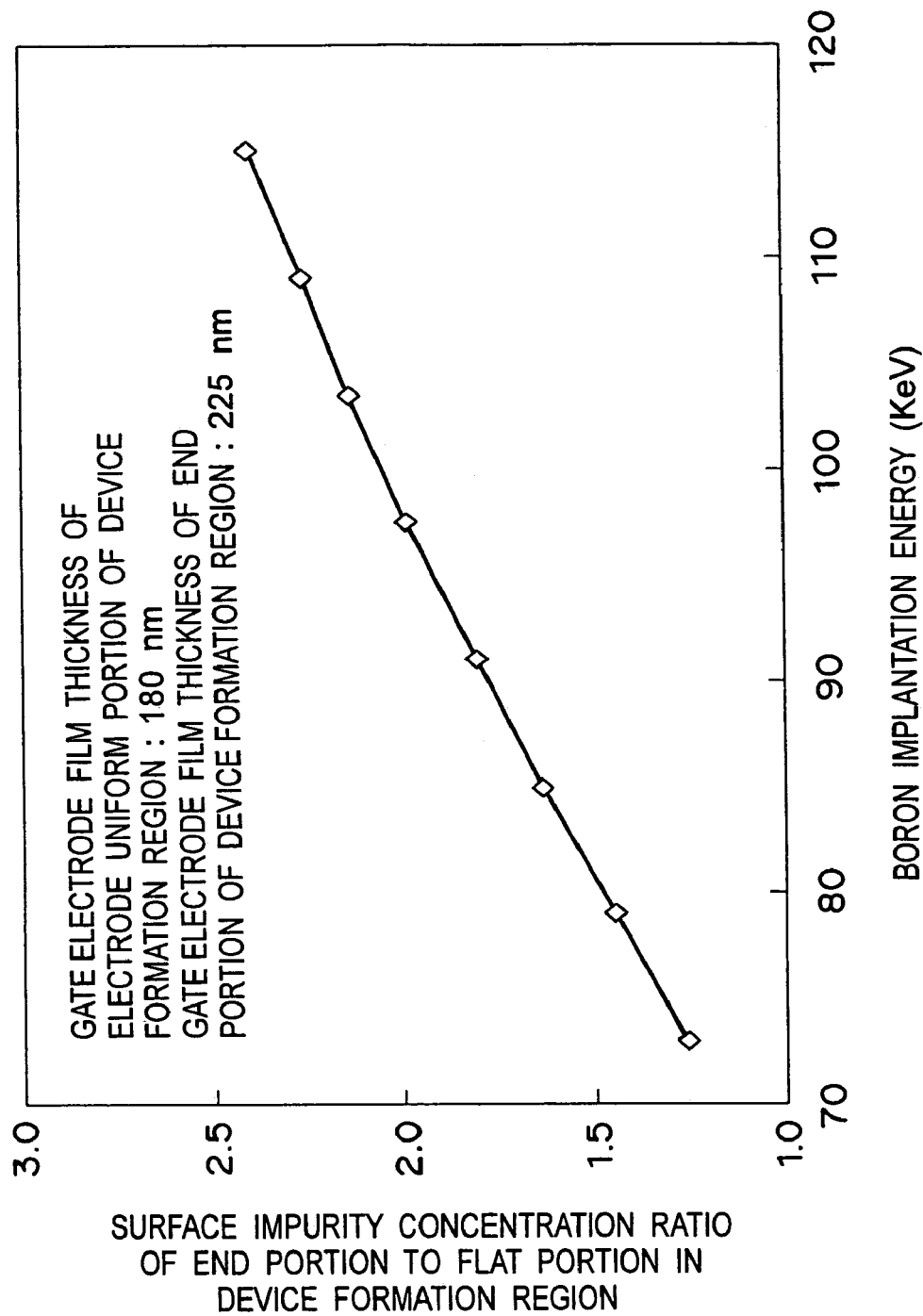
FIG. 3 is a view showing a result of an experiment of ion implantation performed on a silicon substrate in the device formation region with different implantation energies.

Further, with regard to the ion implantation into the silicon substrate 101 via the gate electrode 114, varying the magnitude of the implantation energy allows the ratio of impurity concentration of the silicon substrate 101 surface to be varied between the end portion 11 and the electrode uniform portion 12 of the device formation region. FIG. 3 is a view showing a result of an experiment of ion implantation performed on the device formation region of a silicon substrate 101 similar to this embodiment via the gate electrode 114 with different implantation energies. In FIG. 3, the vertical axis represents a surface impurity concentration ratio obtained by dividing a surface impurity concentration at the end portion 11 of the device formation region by a surface impurity concentration at the electrode uniform portion 12 of the device formation region, while the horizontal axis represents an implantation energy (keV) of ion implantation. In this experiment, the thickness of the gate electrode 114 at the end portion 11 of the device formation region was 225 nm, and the thickness of the gate electrode 114 at the electrode uniform portion 12 of the device formation region was 180 nm. As shown in FIG. 3, by increasing the implantation energy, the surface impurity concentration of the silicon substrate 101 in the end portion 11 with respect to that in the electrode uniform portion 12 of the device formation region can be increased in proportion to the implantation energy. Therefore, when a transistor is formed at the end portion 11 of the device formation region on the silicon substrate 101, the threshold voltage of the transistor is effectively increased by increasing the implantation energy, so that parasitic transistors as well as the inverse narrow channel effect and kink characteristics can be prevented.

As shown above, the silicon substrate 101 corresponding to portions where the gate electrode 114 is relatively thick allows the surface impurity concentration to be effectively increased by increasing the implantation energy. By making use of such an effect, a short-gate transistor to be formed in the relatively narrow width region 14 sandwiched by the two device isolation films 110 as shown in FIG. 1I can be set to a threshold voltage higher than those formed in the other regions 11, 12 without performing ion implantation with an energy different from an implantation energy for transistor formed in the other regions 11, 12. That is, in the narrow width region 14 of the device formation region, the gate electrode 114 has the thickness Dc thicker than in the electrode uniform portion 12. As a result of this, by performing ion implantation of the same implantation energy on the electrode uniform portion 12 and the narrow width region 14 of the device formation region, the surface impurity concentration of the silicon substrate 101 of the narrow width region 14 can be set higher than the surface impurity concentration of the silicon substrate 101 of the electrode uniform portion 12. As a result of this, the ion implantation step that has conventionally been performed for regions where transistors of short gate width are formed independently of the other regions in order to increase the threshold voltage, as well as the photolithography step purposed for execution of this independently performed ion implantation, can be eliminated. That is, the threshold voltage of regions where short-gate transistors are to be formed can be increased with even more simplicity and lower price than conventionally.

Figure 1J:
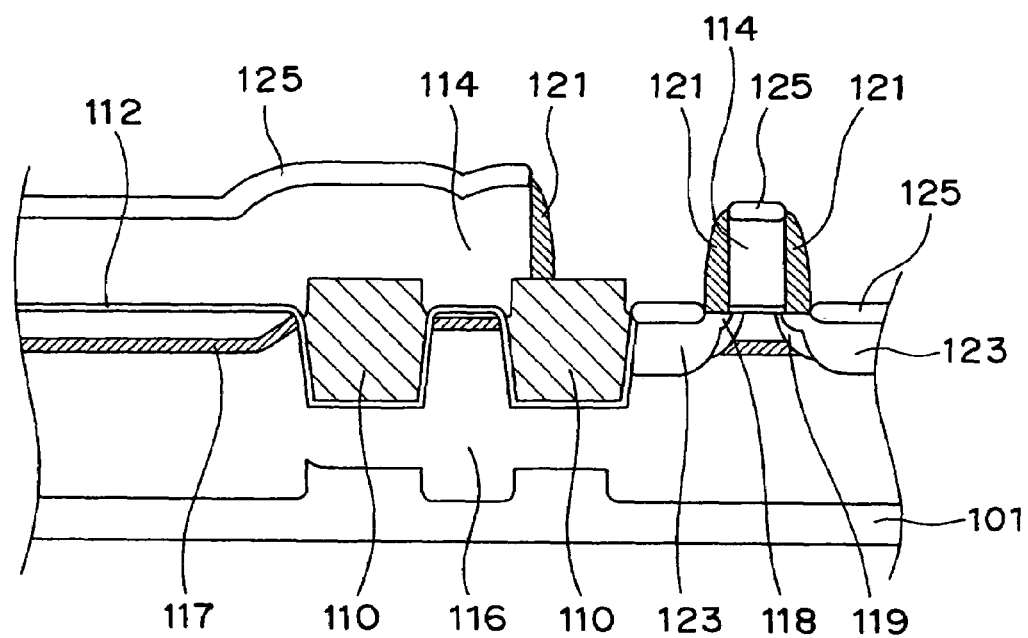
FIG. 1J is a view showing a step subsequent to FIG. 1I.

After the gate electrode 114 is formed all over the wafer by the steps up to FIG. 1I, the step moves to one shown in FIG. 1J, where the transistor is formed in the device formation region 10. That is, the gate electrode 114 is processed into a specified pattern, and an LDD (Lightly Doped Drain) region 118 and a halo region 119 are formed by ion implantation process. Thereafter, silicon oxide is deposited on the wafer surface by CVD process, and the silicon oxide is anisotropically etched back by RIE process, by which gate spacers 121 are formed on side faces of the gate electrode 114. Then, impurities are implanted by ion implantation process, followed by annealing, by which a source and drain region 123 is formed in the vicinity of the surface of the silicon substrate 101. Subsequently, salicide 125 is formed at the surface portion of the gate electrode 114.

Figure 1K:
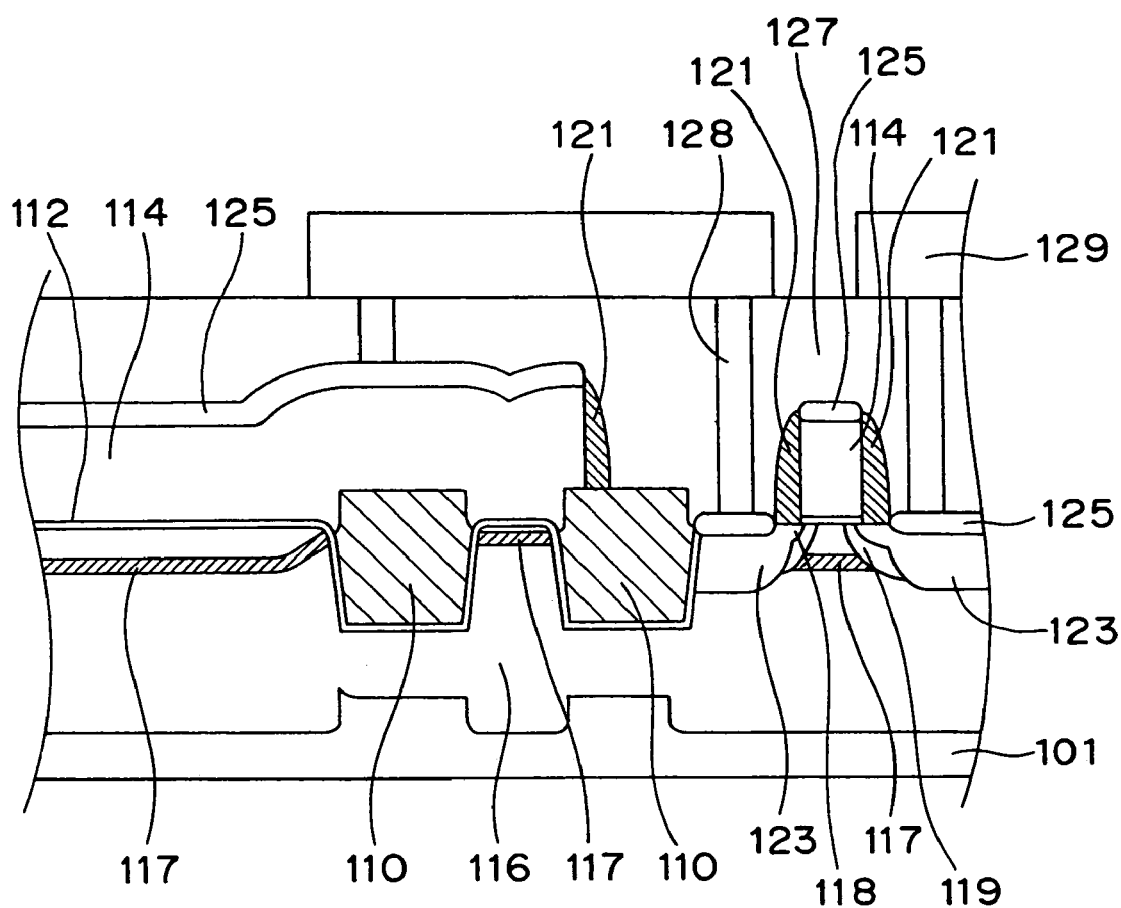
FIG. 1K is a view showing a step subsequent to FIG. 1J.

Then, as shown in FIG. 1K, an interlayer film 127 is formed, and contact 128 and interconnection 129 are formed, by which the MOS transistor is completed in the device formation region.

As shown above, in the transistor of this embodiment, the gate electrode 114 extending from on the device formation region 10 to on the device isolation film 110 is so formed that the thickness Db on the boundary between the device formation region 10 and the device isolation film 110 becomes larger than the thickness Da of the portion of the device formation region away from the boundary. By the introduction of the impurities into the semiconductor substrate 101 of the device formation region 10 by the implantation via the gate electrode 114, the impurity concentration of the semiconductor substrate 101 in the vicinity of the boundary of the device formation region can be set higher than impurity concentration of the semiconductor substrate 101 in portions away from the boundary of the device formation region in a self-alignment fashion. As a result, the threshold voltage can be increased for the transistor formed in the portion 11 in the vicinity of the device formation region, so that parasitic transistors as well as the inverse narrow channel effect and kink characteristics can be prevented.

According to the transistor of this embodiment, the gate electrode 114 is so formed that the thickness Db on the boundary between the device formation region 10 and the device isolation film 110 becomes larger than the thickness Da of the portion 12 of the device formation region away from the boundary. As a result of this, prevention of parasitic transistors as well as prevention of the inverse narrow channel effect and kink characteristics can be achieved without forming large-in-thickness thermal oxide in the device isolation trenches that would be involved in the prior arts. Accordingly, while the prevention of parasitic transistors as well as the prevention of the inverse narrow channel effect and kink characteristics are fulfilled, the device isolation film 110 and the device formation region 10 can be scaled down in response to the scale-down of LSIs.

Embodiments being thus described, it will be obvious that the same may be varied in many ways. Such variations are not to be regarded as a departure from the spirit and scope of the technology, and all such modifications as would be obvious to one skilled in the art are intended to be included within the scope of the following claims.

The invention claimed is:

1. A transistor comprising:
    a device formation region provided on a semiconductor substrate;
    a device isolation film comprising a dielectric film and which defines the device formation region;
    a gate insulator formed in the device formation region; and
    a gate electrode which is formed on the gate insulator and which extends over the whole surface of the device isolation film, wherein
    a surface of the device isolation film on which the gate electrode extends is formed higher in a thickness direction than a surface of the gate insulator, and
    a thickness of the gate electrode at a boundary between the device isolation film and the gate insulator is larger than a thickness of the gate electrode at a position away from the boundary toward the gate insulator side, wherein
    the device isolation film has a flat portion provided inner than a boundary at which the device isolation film adjoins the gate insulator as viewed in a plan view, the flat portion being formed higher in a thickness direction than at the boundary and extending in a planar direction of the semiconductor substrate, and
    a height difference A between a surface of the device isolation film, on which the gate electrode extends, and a surface of the gate insulator, a widthwise distance B from an end of the flat portion of the device isolation film to the boundary, and a thickness D of the gate electrode of the device formation region satisfy following Equations (1) and (2):

$$D > B \tag{1}$$

$$A/D + (1-(B/D)^2)^{0.5} > 1 \tag{2}.$$

2. A transistor comprising:
    a device formation region provided on a semiconductor substrate;
    a device isolation film comprising a dielectric film and which defines the device formation region;
    a gate insulator formed in the device formation region; and
    a gate electrode which is formed on the gate insulator and which extends over the whole surface of the device isolation film, wherein
    a surface of the device isolation film on which the gate electrode extends is formed higher in a thickness direction than a surface of the gate insulator,
    the device isolation film has a flat portion provided inner than a boundary at which the device isolation film adjoins the gate insulator as viewed in a plan view, the flat portion being formed higher in a thickness direction than at the boundary and extending in a planar direction of the semiconductor substrate, and
    a height difference A between a surface of the device isolation film, on which the gate electrode extends, and a surface of the gate insulator, a widthwise distance B from an end of the flat portion of the device isolation film to the boundary, and a thickness D of the gate electrode of the device formation region satisfy following Equations (1) and (2):

$$D > B \tag{1}$$

$$A/D + (1-(B/D)^2)^{0.5} > 1 \tag{2}.$$

3. The transistor as claimed in claim 1, wherein
    an impurity is added in a vicinity of the surface of the semiconductor substrate in the device formation region so that the device formation region has concentrations higher in its portions closer to the device isolation film than in its portions farther from the device isolation film.

4. A transistor manufacturing method comprising the steps of:
    forming first oxide on a semiconductor substrate;
    forming nitride on the first oxide;
    forming a trench which extends through the nitride and the first oxide to reach the semiconductor substrate;
    forming second oxide on a surface of the semiconductor substrate exposed to the trench;
    forming a first dielectric film which buries the trench and which has a surface substantially flush with a surface of the nitride;
    removing the nitride and the first oxide so that the surface of the semiconductor substrate is exposed;
    forming a second dielectric film on the exposed surface of the semiconductor substrate;
    forming an electrically conductive layer on the first dielectric film and the second dielectric film that following Equations (3) and (4) are satisfied; and
    a first impurity addition step for introducing an impurity into the semiconductor substrate via the conductive layer and the second dielectric film by ion implantation process:

$$D > B \tag{3}$$

$$A/D + (1-(B/D)^2)^{0.5} > 1 \tag{4}$$

where A represents a height difference between a surface of the first dielectric film, on which the conductive layer extends, and a surface of the second dielectric film, B represents a widthwise distance from a boundary at which the first dielectric film adjoins the second dielectric film, to an end of a flat portion which is provided inner than the boundary as viewed in a plan view and which is formed higher in a thickness direction than at the boundary and extending in a planar direction, and D represents a thickness of the conductive layer on the second dielectric film.

5. The transistor manufacturing method as claimed in claim 4, further comprising a second impurity addition step for introducing an impurity into the semiconductor substrate by an ion implantation process which differs from the ion implantation process of the first impurity addition step in at least one of implantation energy, impurity implantation amount and impurity.

6. The transistor as claimed in claim 1, wherein said gate electrode is in contact with said gate insulator.

7. The transistor as claimed in claim 2, wherein said gate electrode is in contact with said gate insulator.

* * * * *